United States Patent [19]

Hoss

[11] 4,327,362
[45] Apr. 27, 1982

[54] METER ROTOR ROTATION OPTICAL SENSOR

[75] Inventor: Robert J. Hoss, Plano, Tex.

[73] Assignee: Rockwell International Corporation, El Segundo, Calif.

[21] Appl. No.: 954,046

[22] Filed: Oct. 23, 1978

[51] Int. Cl.³ .......................... G08C 19/36; G01D 5/36
[52] U.S. Cl. .......................... 340/870.02; 250/231 SE; 340/347 P; 340/870.29
[58] Field of Search ............ 340/190, 201 P, 151, 340/347 M, 380, 347 P, 203, 204, 870.02, 870.19, 870.20, 870.29; 250/231 SE, 227; 356/152; 235/92 EL; 179/2 AM

[56] References Cited

U.S. PATENT DOCUMENTS

| | | | |
|---|---|---|---|
| 3,083,357 | 3/1963 | Chapin et al. | 340/204 |
| 3,508,003 | 4/1970 | Moyers | 179/2 AM |
| 3,604,811 | 9/1971 | McMenmin | 250/231 SE |
| 3,754,815 | 8/1973 | Santuary | 250/231 SE |
| 3,806,875 | 4/1974 | Georget | 340/151 |
| 3,849,698 | 11/1974 | Frohbach | 340/347 AD |
| 4,041,483 | 8/1977 | Groff | 250/231 SE |
| 4,137,451 | 1/1979 | Einolf | 340/190 |

OTHER PUBLICATIONS

"A Method of Measuring and Displaying Generator Rotor Angle," Prewett, *The Institution of Elect Engrs.*, Apr. 1958 pp. 605-608.

*Primary Examiner*—James J. Groody
*Attorney, Agent, or Firm*—Howard R. Greenberg; H. Fredrick Hamann

[57] ABSTRACT

Electrical consumption registered in a watthour meter is converted into an electrical analog suitable for transmission to a remote monitoring site by reflecting light off the watthour meter rotor, the light being periodically interrupted during each rotor rotation by a darkened light absorbing area of the rotor which traverses the light beam, passing the light to and from the meter through fiber optic cables and digitally counting at a distant location each of the pulses corresponding to the rotor rotation which are transduced from the light reflections. By generating the light from an AC signal, AC signal processing techniques employed in the light reflection detection circuitry ensure a useable electrical analog with minimal likelihood of error otherwise arising from spurious noise and varying ambient temperature related signals.

10 Claims, 5 Drawing Figures

METER ROTOR ROTATION OPTICAL SENSOR

BACKGROUND OF THE INVENTION

The subject invention relates generally to watthour meters for measuring electrical consumption by utility customers and, specifically to an optical and associated signal processing technique for the operation thereof.

The escalating cost of electricity and opposition thereto on the part of the public and public service commissions has motivated electric utilities to seek novel and resourceful means for minimizing their capital investment as well as to foster energy conservation. One of these means entails the adoption of a communication system to permit remote monitoring of the individual customer loads for rate application purposes as well as remotely controlling the loads in order to curtail same in the event of an emergency or to smooth out the peak demand load curve. In order to remotely monitor electric consumption by a customer, the meter reading must be converted to an equivalent electrical analog for transmission back to the central monitoring site. Although many of the earlier communication systems employ some mechanical arrangement for performing the foregoing electrical signal conversion, some systems such as described in U.S. Pat. No. 3,943,498 perform the conversion directly from the meter rotor rotation rather than from the meter dial reading. The light reflecting technique employed in the foregoing patent, whereby light reflections from the meter rotor using some reflective rotor pattern are used to monitor the rotor rotation and consequently electric consumption through an electrical analog thereof, is suitable for new meter units which can be designed to accommodate the photoelectric detection circuitry that is made a part thereof. However, such would not be the case in retrofitting the millions of existing meters that would have to be modified or replaced in inaugurating a monitoring and control communications system.

Fiber optic techniques for optically transmitting information have found many applications, including remote data reading as delineated in another U.S. Pat. No. 3,806,875. However, the attenuation of the light in the course of transmission, particularly when the light is initially generated from a low power source, for example to minimize cost and miximize lifetime, renders it especially difficult for the light reflection detecting circuitry to recognize genuine electrical analogs in the presence of spurious signals produced by noise and varying ambient temperatures which change component characteristics. Therefore, notwithstanding these prior uses for fiber optic transmission techniques, it is believed that the subject invention affords a unique combination with many notable advantages for adapting existing meters for operation in a monitoring and control communications system.

With the foregoing in mind, it is a primary object of the present invention to provide a new and improved means for remotely monitoring the rotation of a watthour meter rotor to produce an electrical analog of the electric consumption.

It is a further object of the present invention to provide such a new and improved rotation monitoring means through the use of fiber optic techniques which facilitate the adaptation of existing meters for use in modern monitoring and control communications systems.

It is still a further object of the present invention to provide such a rotation monitoring means which entails signal processing techniques for minimizing the adverse effects of noise and varying ambient temperatures and which affords digital implementation to promote cost effectiveness.

The foregoing objects as well as others and the means by which they are achieved through the present invention may be best appreciated by referring to the Detailed Description of the Invention which follows hereinafter together with the appended drawings.

BRIEF DESCRIPTION OF THE INVENTION

In accordance with the foregoing stated objects, the present invention entails apparatus for beaming a light onto a meter rotor whose metallic surface normally reflects light therefrom except for a darkened light absorbing area thereof which traverses the light beam so that each rotor rotation produces an interval in which no light is reflected. The light is generated and the reflections detected at a location remote from the meter rotor through the use of fiber optic bundles thereby eliminating any need to encumber the meter rotor housing with the electrical detection circuitry. The light is generated from a light emitting diode that is driven from an AC signal source, thereby allowing AC filtering techniques to eliminate the adverse effects of noise in detecting each of the electrical pulses which are transduced from the light reflections corresponding to each rotor rotation. The meter rotations are monitored by applying the detected pulses to a digital counter which then affords a cumulative count of the rotations. A further feature of the invention is the use of a hysteresis circuit for providing a bilevel threshold to distinguish between the presence and absence of light reflections so as to obviate any errors which might be created at the boundaries of the darkened area of the meter rotor.

DETAILED DESCRIPTION OF THE INVENTION

Figure 1:
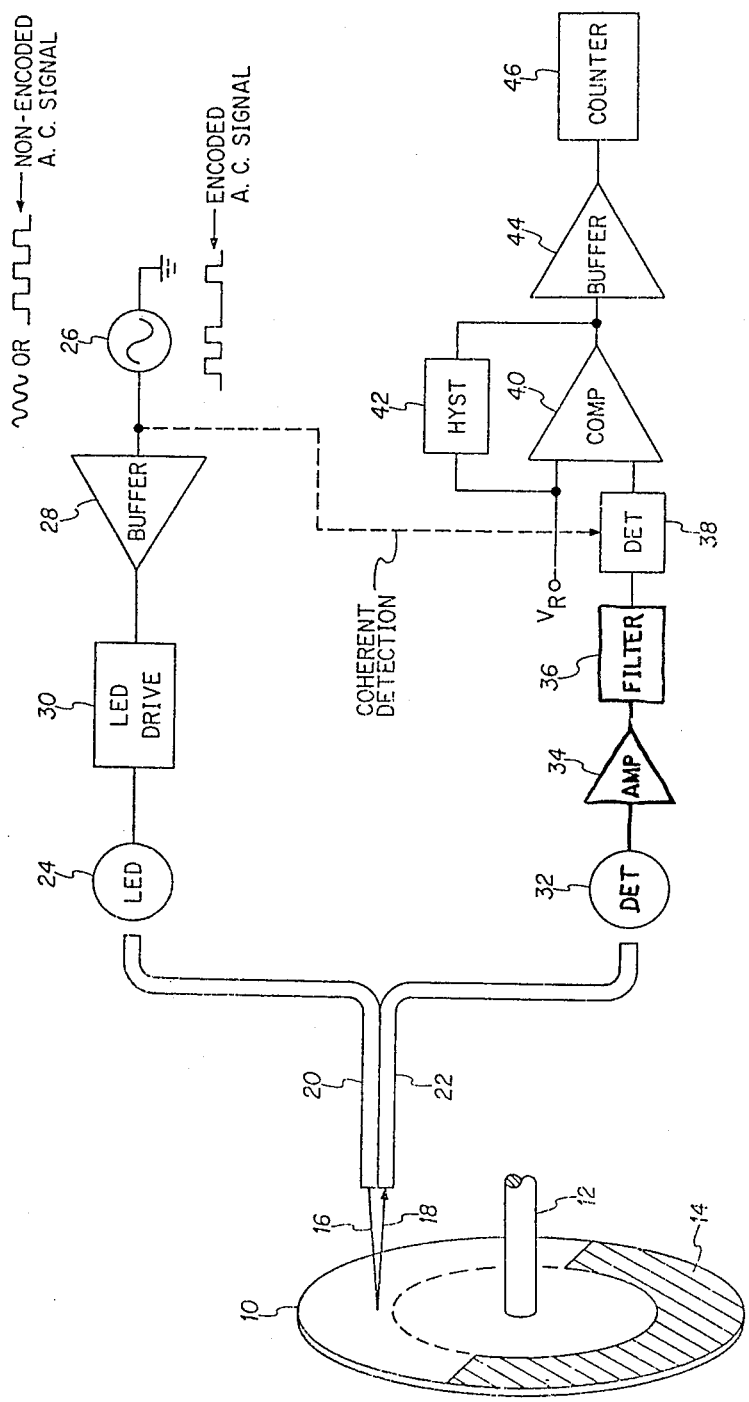
FIG. 1 depicts the various components of the invention including the electrical circuitry for generating and transmitting the light and for receiving and transducing an electrical signal from the reflected light.

As shown in FIG. 1, a watthour meter rotor 10 which rotates about central axis 12 has a shiny surface which reflects light therefrom except for a darkened portion 14 which absorbs light rather than reflect it. The conventional metallic surface of rotor 10 is normally shiny enough to reflect light without any modification while the darkened portion 14 can be provided through a black applique applied to the rotor 10. A beam of light 16 is directed onto the meter rotor surface so that it impinges thereon within the circumscribed darkened portion 14 (as indicated by the dashed curve delineated on rotor 10) so that during each rotation of the meter rotor 10 a beam of light 18 is reflected therefrom except when the darkened portion 14 traverses the light beam 16.

The light to and from the surface of meter rotor 10, which preferably should be in the infra-red light 800-950 nanometer wavelength range to reduce interference from ambient radiation in the visible range, is routed by fiber optic bundles 20 and 22, respectively, to a remote location where the electrical circuitry is provided for generating and transmitting the light and receiving and detecting light reflections. Although the fiber optic bundles 20 and 22 may consist either of glass or plastic fiber, glass composition fibers are preferred since they afford light attenuations which are typically lower in the preferred 800-950 nm wavelength range for infra-red light. The use of fiber optic bundles 20 and 22 allows the electrical circuitry for generating the illuminating light and detecting the light reflections to be remotely located from the meter housing so that existing meters may continue to be used with only slight modification, namely applying a dark applique or equivalent to the rotor to provide the darkened area 14 and simply deploying the cables 20 and 22 in the housing, as discussed further on.

The light is generated through a light emitting diode 24 which is energized from an AC signal source 26 with a nonencoded sinusoidal or 50% duty cycle square wave signal which can be envelope (amplitude) or coherently (phase) detected or an encoded signal comprising a sequence of pulses having a varying duty cycle which can be coherently detected. The AC signal is applied to light emitting diode 24 via a buffer and driver stages 28 and 30, respectively. Driver stage 30 ensures sufficient current for energizing light emitting diode 24 while buffer 28 serves to properly interface driver 30 with oscillator 26. Three kilohertz has been found to be a suitable frequency for oscillator 26.

The receiver for detecting light reflections comprises a photodetector 32 which transduces the light to an AC electrical signal which is amplified by amplifier 34 and then applied via a bandpass filter 36, which filters out undesired frequencies, to an envelope detector circuit 38 which provides an output DC signal that is proportional to the amplitude of the nonencoded AC signal. If greater signal discrimination is desired or needed then a coherent detector can be used in lieu of encoder detector 38 for comparing the phase or the encoding of the received nonencoded and encoded signals, respectively, with that of the transmitted signal. In the case of an encoded signal, a low pass filter capable of passing the encoded signal would be used in lieu of bandpass filter 36. A comparator circuit 40 compares the output of detector 38 with a reference voltage $V_R$ that establishes a threshold level which must be exceeded for generating a DC signal at its output. Such a DC signal will be present whenever sufficient light is reflected from rotor 10 during each of its rotations, while it will be absent during light non-reflections created by the darkened area, resulting in a signal pulse per rotor rotation. Although a single reference voltage $V_R$ could be employed, it has been found desirable to use two reference voltages through a hysteresis circuit 42, there being one level in the presence of reflected light and a second higher level in the absence thereof. This will be elaborated upon shortly. The output of comparator 40 is applied via a buffer circuit 44 to a digital counter 46 which accumulates the pulse count that is indicative of the number of rotations of meter rotor 10, and consequently electric consumption, which can then be transmitted through appropriate circuitry to a remote monitoring site.

Figure 2:
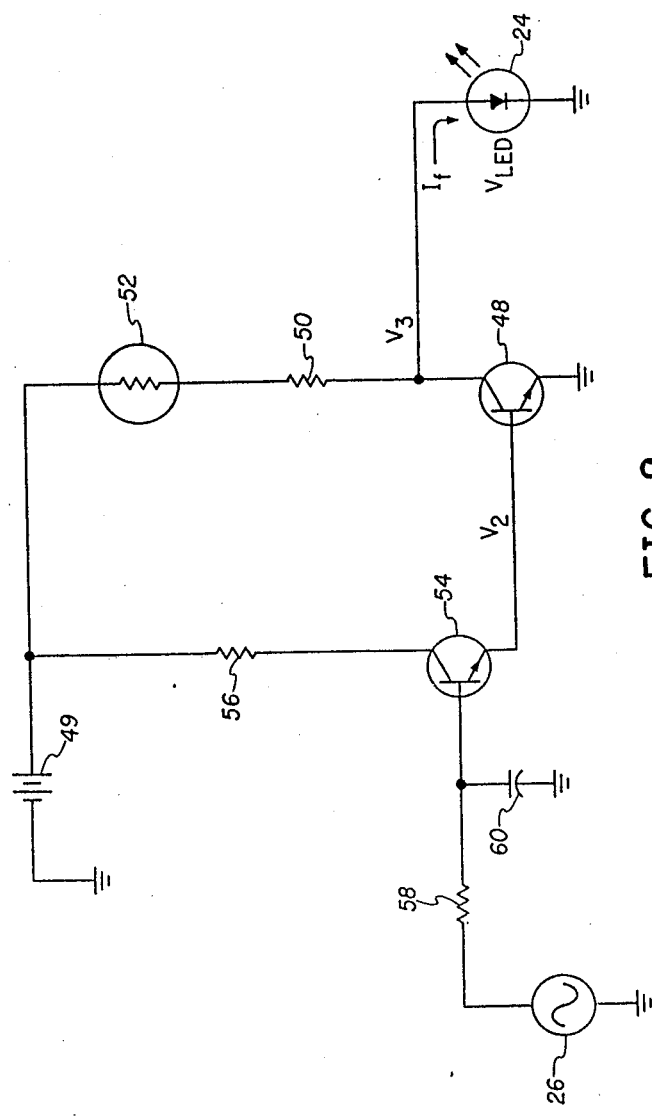
FIG. 2 is a schematic drawing of the light generator and transmitter.

A practical circuit for driving light emitting diode 24 is shown in FIG. 2 wherein the diode 24 is connected across the collector/emitter junction of an npn. transistor 48, with the collector thereof being connected to a positive terminal of a negatively grounded DC power supply 49 through a resistor 50 and thermistor 52. The buffer stage 28 for driving transistor 48 consists of an npn. transistor 54 whose emitter is connected to the base of transistor 48 and whose collector is connected to the positive terminal of the DC power supply 49 through a resistor 56. The base of transistor 54 is connected to the output of grounded oscillator 26 through a resistor 58 with a capacitor 60 being connected between the transistor 54 base and ground. The combination of resistor 58 and capacitor 60 act as a lowpass filter to reduce the high frequency harmonic components of the switching currents, which, for example, would be associated with a square wave AC signal at the output of oscillator 26. When transistor 54 is conductive during the positive half cycle of the output AC signal from oscillator 26 it turns on transistor 48 thereby depriving light emitting diode 24 of sufficient current to produce any light. When transistor 54 is cutoff during the negative portion of the AC signal it likewise turns off transistor 48 which allows sufficient current to flow from the DC power supply 49 to the light emitting diode 24 to cause light to be generated. Thermistor 52 is included in the circuit to counteract the adverse effects of increasing temperatures on light emitting diode 24 whose output light decreases as the temperature increases. Increasing temperatures will reduce the resistance of thermistor 52 thereby causing more current to flow through light emitting diode 24 to compensate for its otherwise reduced light output.

Figure 3:
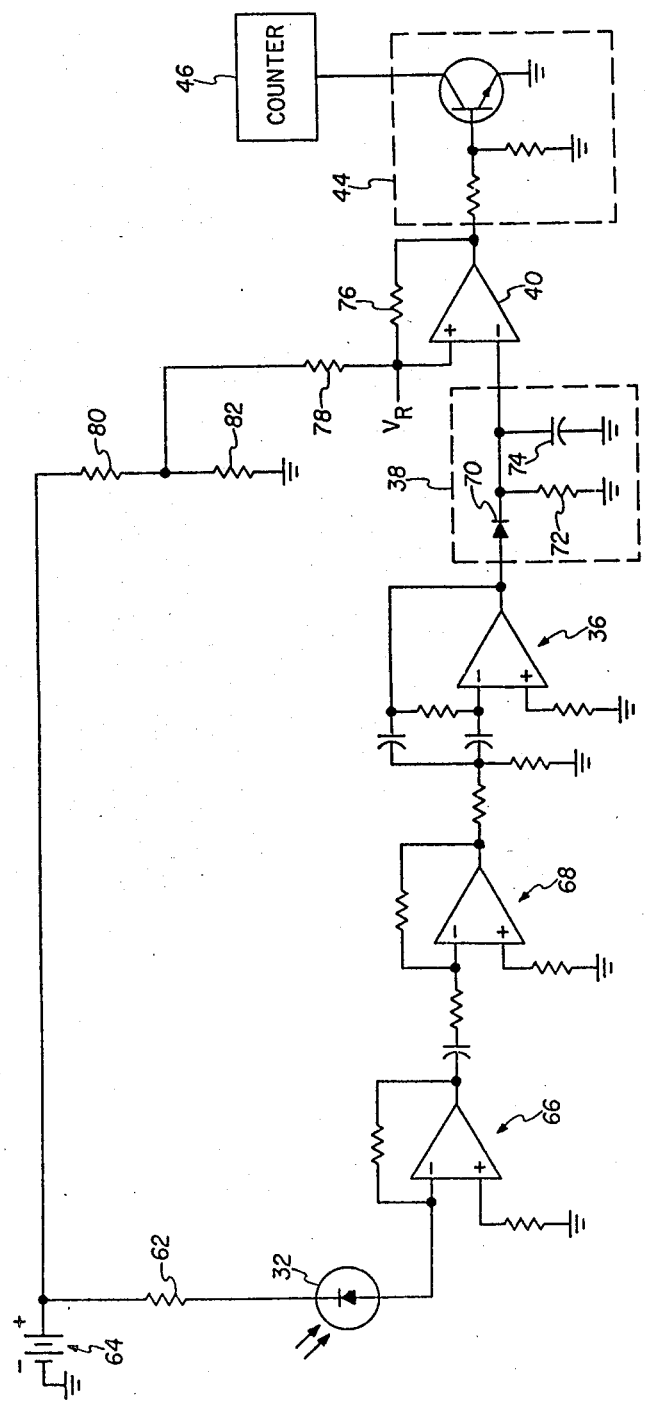
FIG. 3 is a schematic drawing of the receiver portion of the electrical circuitry.

A practical circuit for the receiver is depicted by the schematic diagram of FIG. 3 whose operation will be readily apparent to those skilled in the art. A photodetector diode 32 is connected between the positive terminal of a negatively grounded DC power supply 64 through a resistor 62 and a preamplifier 66 which is followed with a postamplifier 68. Bandpass filter 36 passes the signals within its bandpass to detector 38 which consists of a halfwave rectifying diode 70 and a resistor 72 in parallel with a capacitor 74 which constitute an averaging circuit, with capacitor 74 storing the energy corresponding to the peak value of the AC signal produced at the output of bandpass filter 36.

The DC signal developed across capacitor 74 is applied to the inverting (−) input of operational amplifier comparator 40 which employs positive feedback via resistor 76 connected between its output and its non-inverting (+) input. The non-inverting input of comparator 40 is connected to the DC power supply 64 through resistors 78 and 80 with another resistor 82 connected between the interconnection of the two foregoing resistors and ground. This divider arrangement affords the bilevel voltage reference $V_R$ for providing two threshold levels as previously alluded to. When the output of comparator 40 is high, corresponding to a low signal at its inverting input (no light reflections), the voltage reference $V_R$ to its non-inverting input is likewise high. When the voltage developed across capacitor 74 is high, corresponding to the presence of light reflections, the output of comparator 40 is low with the voltage reference $V_R$ to the non-inverting input likewise going low in tracking fashion. The relative values for the two reference voltages $V_R$ is, of course, determined through voltage division with respect to resistors 76-82.

The bilevel output of comparator 40 is applied via buffer 44, as shown in FIG. 3, to the counter 46 wherein the pulses corresponding to the rotations of rotor 10 are accumulated, with the cumulative count being available for transmission to a central monitoring site.

Figure 4:
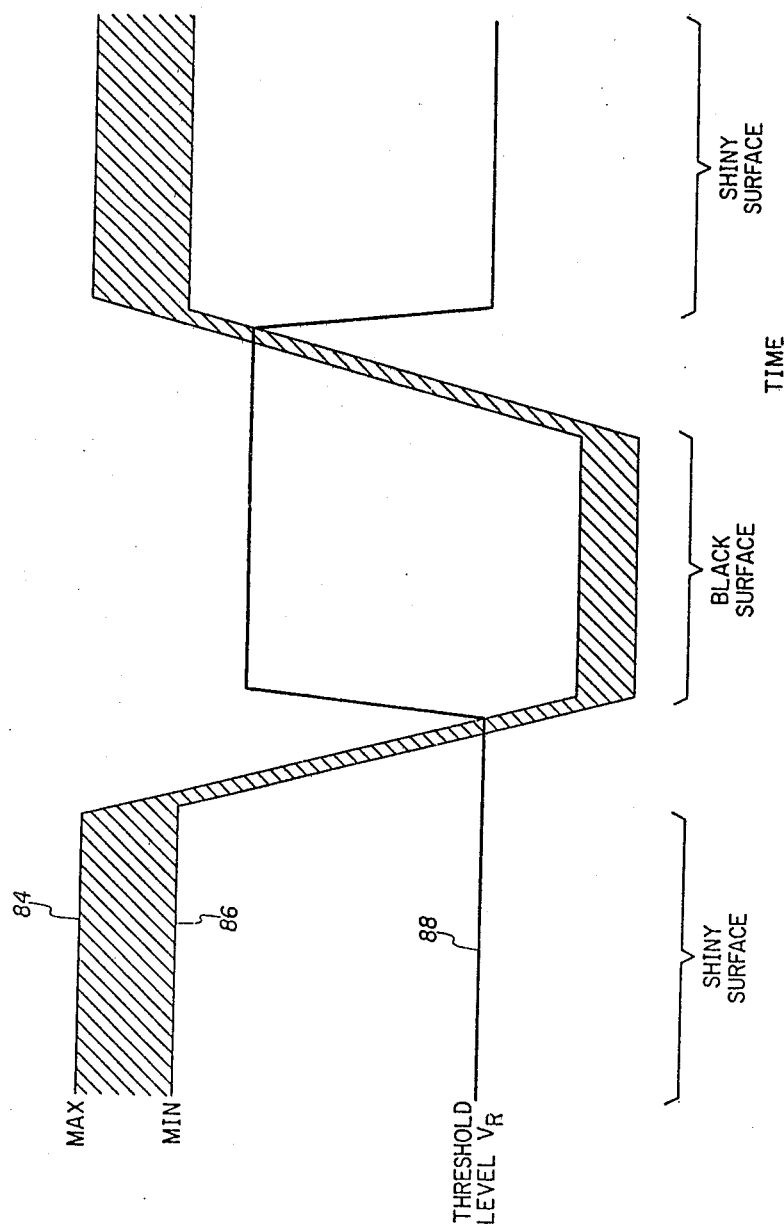
FIG. 4 depicts the hysteresis loop feature of the invention for avoiding any ambiguities at the boundaries of the darkened area of the meter rotor.

The beneficial effect of employing hysteresis with the comparator 40 is depicted in FIG. 4 wherein the two output rotation transition curves 84 and 86, for detector 38 represent respectively, the maximum and minimum attainable signals corresponding to light reflections (in the two end "shiny surface" zones of FIG. 4) and non-reflections (in the middle "black surface" zone). During light reflections, the threshold level 88 is set low while in the absence of light reflections the threshold level is set high. This renders it more difficult to identify a light reflection once an interval of non-reflection has begun, thus avoiding what might otherwise contribute to erroneous readings created by varying or spurious signals at the boundaries of the darkened area 14 of meter rotor 10. This is most important since the meter rotations determine energy consumption and, consequently, the customer's bill dependent thereon.

Figure 5:
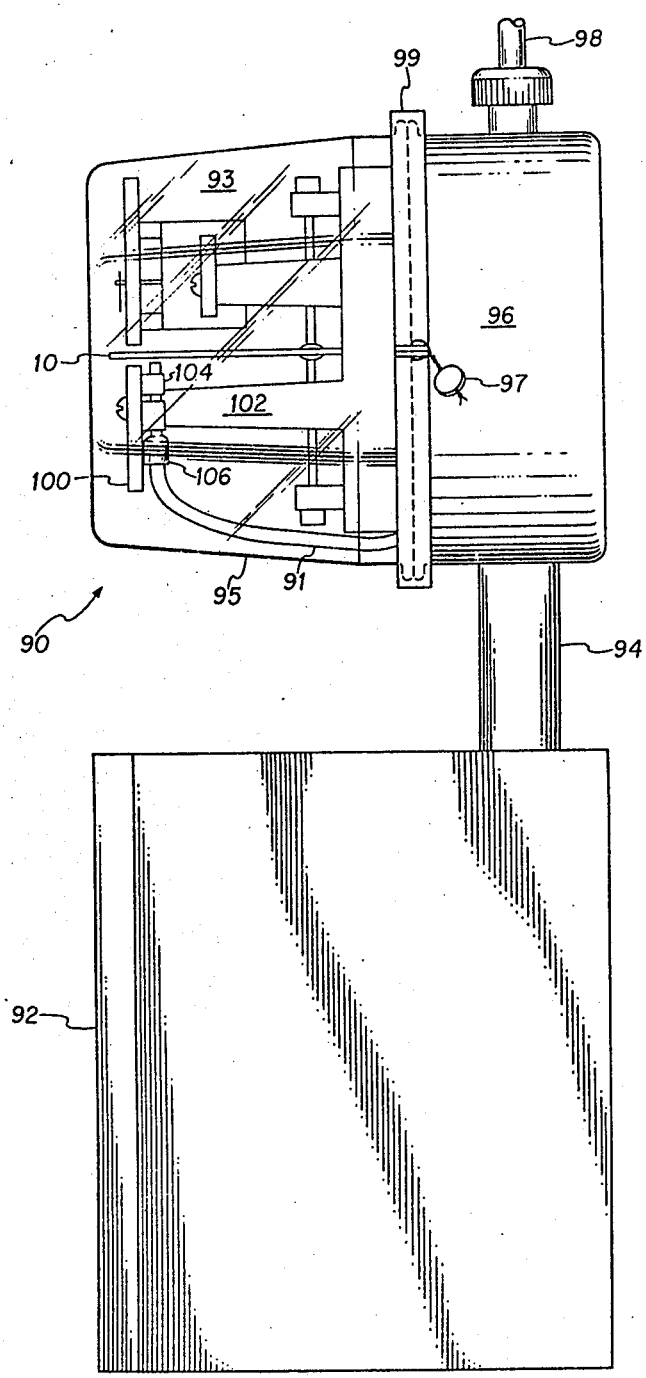
FIG. 5 presents the physical configuration of a typical watthour meter modified to incorporate the invention therein.

The simplicity in physically adapting existing electric meters to accomodate the electronics of the invention is demonstrated in FIG. 5 which is a side view of a typical electric meter after being so modified. All of the electronic circuitry for generating and transmitting the light to the electric meter 90 and detecting the light reflections therefrom is housed in a box 92 separated therefrom by a conduit 94 which carries the fiber optic bundles 20 and 22, constituting a single cable 91, therebetween. The cable 91 is routed into the meter compartment 93, which is visible through the glass cover 95, through a breather-hole (not shown) normally provided in the metal partition separating the meter compartment from the meter base 96 into which the electric power circuits are routed via conduit 98. The glass cover 95 is removed from the base 96 by opening lock 97 and detaching rim 99.

The fiber optic bundles 20 and 22 are affixed in place in the meter compartment 93 through a bracket 100 which may be screwed to or otherwise attached to arm 102 behind a face plate (not shown) mounted thereon. The cable 91 is affixed to the bracket 100 through a clip 104 mounted thereon into which a ferrule terminal 106 at the end of the cable 91 is snapped, bringing the fiber optic bundle ends in close juxtaposition with the rotor 10. It is to be noted that this arrangement entails no physical reconfiguration of the meter compartment, requiring only the emplacement of the bracket 100 and the application of the applique 14 to the rotor 10. Thus the existing electric meter can be facilely adapted to provide the rotor rotation sensing signals at a remote point without tampering with the sensitive mechanism thereof.

As the foregoing demonstrates, the subject invention affords a facile means for adapting existing watthour meters to provide an electrical signal suitable for transmission to a remote monitoring site indicative of the meter rotor rotations and consequently electrical consumption. By employing light reflections coupled with fiber optic techniques all of the electrical circuitry for generating and detecting the light can be physically separated from the meter to minimize modifications to its housing. Moreover, by transducing an AC signal rather than a DC signal, the signal processing techniques of filtering and hysteresis minimize the likelihood of erroneous readings arising from spurious signals created by noise and component characteristic changes resulting from varying ambient temperatures. Since modifications to the foregoing description may occur to those skilled in the art which verywell may not constitute a departure from the scope and spirit of the invention, the description is intended to be merely exemplary and not circumscriptive of the invention as it will now be claimed hereinbelow.

What is claimed is:

1. Rotation sensing apparatus for monitoring at a remote location the rotations of a meter rotor having a light reflecting surface except for a circumferentially disposed non-reflecting portion whose arc is less than the meter circumference, comprising:

a light source at the remote location from the meter whose rotor rotations are to be monitored including a transducer for converting electric energy to light and an AC signal source for energizing said transducer;

a first fiber optic bundle for routing the light from said source to the meter to be beamed onto the circumferential section of the surface of the rotor containing the non-reflecting and reflecting portions at it rotates therepast;

a second fiber optic bundle for routing light reflected from the surface of said rotor back to the remote location;

detection means at the remote location, including a transducer for converting the periodic light reflections from the surface of the rotor as it rotates to electrical AC analogs, discrimination means for passing only AC analogs which bear a predetermined relationship to said AC signal source and means for converting the passed AC analogs to electrical pulse analogs, and counting means connected to said detection means for accumulating the number of said electrical pulse analogs.

2. The rotation sensing apparatus of claim 1 wherein said electrical pulse analogs are DC signals and said discrimination means is a filter for passing only AC analogs whose frequencies fall within a predetermined band about the frequency of the signal produced by said AC signal source and said detection means includes means for converting the passed AC analogs to said DC signals.

3. The rotation sensing apparatus of claim 1 wherein said electrical pulse analogs are DC signals and said discrimination means is a coherent detector for passing only AC analogs whose phase is coherent with the signal generated by said AC signal source and said detection means including means for converting the passed AC analogs to said DC signals.

4. The rotation sensing apparatus of claims 2 or 3 wherein said detection means includes threshold circuit means for providing said electrical pulse analogs whenever the output of said discrimination means exceeds a predetermined threshold level.

5. The rotation sensing apparatus of claim 4 wherein said threshold circuit means affords two predetermined threshold levels, one level in the presence of light reflections and a higher level in their absence.

6. A method of adapting a meter rotor, having a light reflecting surface, to provide at a remote location electrical signal indications of the number of its rotations, comprising:

overlaying a portion of a section of the rotor which is to traverse a light beam with a light absorptive non-reflecting material;

generating a light at the remote location by transducing an AC signal;

transmitting the light via a fiber optic bundle to the meter rotor for beaming onto the non-reflecting and reflecting portions of its surface as it rotates;

transmitting the light reflections from the rotor surface via another fiber optic bundle back to the remote location;

transducing the periodic light reflections from the rotor surface to electrical AC analogs;

discriminating by passing only AC analogs which bear a predetermined relationship to said AC signal;

converting the passed AC analogs to electrical pulse analogs; and counting the electrical pulse analogs.

7. The method of claim 6 wherein said electrical pulse analogs are DC signals and said discriminating entails passing only AC frequencies which fall within a predetermined band about the frequency of said AC signal and said converting entails converting the passed AC analogs to said DC signals.

8. The method of claim 6 wherein said electrical pulse analogs are DC signals and said discriminating entails passing only AC signals whose phase is coherent with said AC signal and said converting entails converting the passed AC analogs to said DC signals.

9. The method of claims 7 or 8 including generating said electrical pulse analogs whenever the amplitude of the AC electrical analogs following discriminating exceeds a predetermined thereshold level.

10. The method of claim 9 including providing two threshold levels, one level in the presence of light reflections and a higher level in their absence.

* * * * *